United States Patent
Imada et al.

(10) Patent No.: US 7,432,218 B2
(45) Date of Patent: Oct. 7, 2008

(54) METHOD FOR PRODUCING POROUS BODY

(75) Inventors: Aya Imada, Yokohama (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 221 days.

(21) Appl. No.: 11/211,527

(22) Filed: Aug. 26, 2005

(65) Prior Publication Data

US 2006/0054507 A1    Mar. 16, 2006

(30) Foreign Application Priority Data

Sep. 1, 2004    (JP)    ............................. 2004-254835

(51) Int. Cl.
*H01L 21/31* (2006.01)
(52) U.S. Cl. .................. 438/778; 438/781; 438/960
(58) Field of Classification Search .......... 205/206, 205/213, 223, 324; 438/778, 780, 781, 960, 438/608
See application file for complete search history.

(56) References Cited

U.S. PATENT DOCUMENTS

| | | | | |
|---|---|---|---|---|
| 3,886,052 | A * | 5/1975 | Smith | 205/172 |
| 4,968,389 | A * | 11/1990 | Satoh et al. | 205/106 |
| 6,139,713 | A * | 10/2000 | Masuda et al. | 205/206 |
| 6,214,738 | B1 | 4/2001 | Aiba et al. | 438/707 |
| 6,541,386 | B2 | 4/2003 | Aiba et al. | 438/707 |
| 6,737,668 | B2 | 5/2004 | Den et al. | 257/9 |
| 6,878,634 | B2 | 4/2005 | Imada et al. | 438/700 |
| 2004/0048092 | A1 * | 3/2004 | Yasui et al. | 428/642 |
| 2005/0167852 | A1 | 8/2005 | Imada et al. | 257/779 |
| 2006/0194433 | A1 | 8/2006 | Saito et al. | 438/688 |

FOREIGN PATENT DOCUMENTS

JP    10-121292    5/1998

OTHER PUBLICATIONS

Masuda et al., *Jpn. J. Appl. Phys.*, vol. 31, No. 5, pp. 493-499 (1996).

* cited by examiner

*Primary Examiner*—Kevin M Picardat
(74) *Attorney, Agent, or Firm*—Fitzpatrick, Cella, Harper & Scinto

(57) ABSTRACT

A process of a porous body comprises the steps of disposing a first material in which pores are formed by anodization on a substrate to form a first layer, disposing on the first layer a second material which has a hardness lower than that of the first material and an oxide of which is dissolved by an anodization step to form a second layer, forming a concave structure on a surface of the second layer, oxidizing the second layer, and subjecting the first layer to anodization to dissolve the second layer.

A magnetic recording medium or a light-emitting element comprises a first layer which is comprised of an oxide of aluminum and comprises a porous portion on a substrate, and a second layer on the first layer which has a hardness lower than that of the first layer and is comprised of a metal element, wherein the pores are packed with a magnetic substance or a light-emitting material.

14 Claims, 3 Drawing Sheets

METHOD FOR PRODUCING POROUS BODY

BACKGROUND OF THE INVENTION

1. Field of the Invention

The present invention relates to a porous body, a structure obtained by packing the porous body with a material, and a method for production thereof.

2. Related Background Art

As a technique for fabricating a minute porous structure on the surface of an object, a technique known as anodization has been known in the past. This technique immerses aluminum or silicon as an anode into a solution, and carries out etching through an applied electric field, to thereby produce pores in which the pore diameter is of a nanometer scale.

If an electric field is applied to an acidic electrolyte in which an aluminum substrate, for example, serving as an anode has been immersed, a porous shaped anodized film is formed from the aluminum surface. A characteristic of this porous shaped anodized film is that the film possesses a particular structure in which minute cylindrical pores (alumina nanopores) having a diameter of between a few nm and a few hundred nm are arrayed in intervals of from several tens of nm to several hundred nm. Such pores possess an extremely high aspect ratio, and have excellent cross-sectional diameter uniformity. The intervals and aspect ratio of a fabricated porous structure can be controlled by the anodization conditions. Usually, a pore interval is proportional to the applied voltage during anodization, and the pore depth is proportional to the anodization time. Further, pore diameter can be arbitrarily expanded by, after carrying out anodization, dipping alumina into a solution such as aqueous phosphoric acid which uniformly etches.

An alumina nanopore away fabricated in such a way is random. Nevertheless, a phenomenon is known wherein to a certain extent pores naturally away in an orderly manner as a result of etching for a long period of time under constant anodization conditions (type of solution, solution temperature, applied voltage, etc.) known as self-regularization conditions.

A technique which has also been devised to make a nanopore array more orderly forms a pore formation starting point, such as a recess, prior to carrying out anodization. This technique is a method (nanoimprinting process) which forms a pore by using a recess to act as a starting point through anodization, wherein a recess is fabricated on an aluminum surface as a pore formation starting point using a stamper or the like provided with a protrusion (U.S. Pat. No. 6,139,713; Masuda, "Kotai Butsuri (Japanese Journal of Applied Physics)" 31, p. 493 (1996)).

According to this technique, a stamper provided with a protrusion is pressed onto the surface of an aluminum substrate, whereby a recess is formed on the aluminum substrate surface, to thereby fabricate an anodization pore formation starting point. Therefore, compared with forming a recess directly on the aluminum surface by electron beam lithography or a similar method, although high pressure is required, a desired array of recesses that are completely orderly can be formed easily in a short period of time. By forming a desired array of recesses in advance, pores can be formed with the recesses as starting points, whereby as a result an orderly pore (nanopore) structure can be obtained in a desired array.

The fabrication of a high aspect porous body formed in an orderly manner such as this is extremely difficult using a conventional method such as photolithography, electron beam exposure, X-ray exposure or the like. In addition, since particular added functionality can be expected that differs from a random structure, this technique has been paid a great deal of attention in recent years. Furthermore, in addition to proposals for packing a metal, semiconductor or magnetic substance into such a structure, there have also been proposals made for a variety of applications, such as coloration, an EL device, an electrochromic device, a solar cell, a vacuum microdevice, a magnetic device or magnetic recording medium, a photonic device, a quantum effect device, a chemical sensor and the like.

However Japanese Patent Application Laid-Open No. H10-121292 discloses that high pressure is required if providing a recess on an aluminum substrate surface, as a stamper is being directly pressed onto the aluminum substrate. In addition, due to the high pressure, on occasion the stamper protrusion will be missing, whereby it becomes impossible to form a desired starting point.

The present invention has been created in view of such background art, wherein it is an object of the present invention to form a nanopore in a desired array without requiring high pressure.

It is also an object of the present invention to provide a more orderly porous body by having an oxidation step.

SUMMARY OF THE INVENTION

The present invention is directed to a method for producing a structure using a nanoimprinting method and anodization, whereby a minute porous body can be produced easily. In addition, a structure can be produced wherein the porous body is packed with a filler.

According to an aspect of the present invention, there is provided a process for forming a porous body comprising the steps of:

(a) disposing a first material in which pores are formed by anodization on a substrate to form a first layer;

(b) disposing on the first layer a second material which has a hardness lower than that of the first material and an oxide of which is dissolved by an anodization step to form a second layer;

(c) forming a concave structure on a surface of the second layer;

(d) oxidizing the second layer; and (e) subjecting the first layer to anodization to dissolve the second layer.

The first material is preferably comprised of a material containing aluminum as a main component.

The second material is preferably comprised of a material containing a metal element.

The second material is preferably comprised of a material containing aluminum alkoxide as a main component.

The second material is preferably comprised of a metal containing indium or tin.

The step (c) is preferably a pressing step using a press member comprising a plurality of regularly arranged convex structures.

The process preferably further comprises a step (f) of immersing the porous body formed in the step (e) in a gas or a liquid which corrodes both an oxide of the first material and an oxide of the second material to dissolve the oxide of the first material, whereby the pore diameter is enlarged.

Alternatively, the process preferably further comprises a step (g) of packing pores of the porous body described above with a filler to form a structure.

The filler is preferably a magnetic substance, a dielectric, or a light-emitting material.

Further, the present invention can produce a porous body in the steps fewer than in the conventional art by employing a metal for the second material.

According to another aspect of the present invention, there is provided a process for producing a porous body comprising the steps of:

(a) disposing a first material in which pores are formed by anodization on a substrate to form a first layer;

(b) disposing on the first layer a second material which has a hardness lower than that of the first material and an oxide of which is dissolved by an anodization step to form a second layer;

(c) forming a concave structure on a surface of the second layer; and (e) subjecting the first layer and the second layer to anodization.

The second material is preferably made of indium or tin.

Furthermore, the present invention can also provide a magnetic recording medium and an optical functional device.

According to still another aspect of the present invention, there is provided a magnetic recording medium comprising a first layer which is comprised of an oxide of aluminum and comprises a porous portion on a substrate, and a second layer on the first layer which has a hardness lower than that of the first layer and is comprised of a metal element, wherein the pores are packed with a magnetic substance.

According to a further aspect of the present invention, there is provided a light-emitting element comprising a first layer which is comprised of an oxide of aluminum and comprises a porous portion on a substrate, and a second layer on the first layer which has a hardness lower than that of the first layer and is comprised of a metal element, wherein the pores are packed with a light-emitting material.

According a further aspect of the present invention, there is provided a process for producing a porous body comprising the steps of:

(a) disposing a first material to form a first layer;

(b) disposing a second material which has a hardness lower than that of the first material to form a second layer on the first layer;

(c) forming a concave structure on a surface of the second layer;

(d) oxidizing the second layer; and (e) subjecting the first layer and the second layer to anodization to form a pore in the first layer.

DETAILED DESCRIPTION OF THE PREFERRED EMBODIMENT

The present invention will now be explained in more detail.

The method for producing a porous body according to the present invention comprises the following steps of:

(a) forming a first layer by disposing a first material whose pores are formed by anodization on a substrate;

(b) forming a second layer by disposing a second material on the first layer which has a hardness lower than that of the first material and whose oxide is dissolved by an anodization step;

(c) forming a concave structure on the surface of the second layer;

(d) oxidizing the second layer; and (e) subjecting-the first layer and the second layer consisting of the second material oxidized in the step (d).

By going through these steps, a porous body can be obtained in which the pores are arrayed in an orderly manner.

The term "pore" in the present invention encompasses pores, nanopores, porous film openings and the like. A pore diameter is preferably in the range of between several nm and several hundred nm.

The production method according to the present invention may further comprise a step (f) of dipping the porous body formed as a result of the steps (a) through (e) in a gas or a liquid which allows corrosion of both an oxide of the first material and an oxide of the second material to dissolve the oxide of the first material, in order to enlarge the pore diameter.

The production method according to the present invention may still further comprises a step (g) of packing the porous body obtained as a result of the steps (a) through (e) or the steps (a) through (f) with a filler.

Figure 1A:
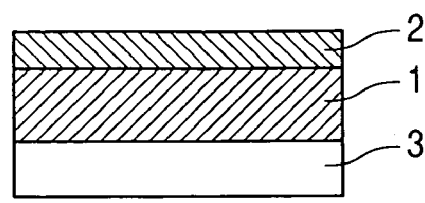
FIGS. 1A, 1B, 1C, 1D and 1E are cross-sectional views explaining the steps (a) through (f) of the present invention.

A specific embodiment of the present invention will now be described. As illustrated in FIG. 1A, in the step (a) a first layer 1 consisting of a first material is formed on a supporting substrate 3 consisting of silicon, glass or similar material. As the first material, any material in which pores are formed by anodization is acceptable, although aluminum or an aluminum alloy is preferable. The first layer is formed by sputtering, vapor deposition or a similar process.

As illustrated in FIG. 1A, in the step (b) a second layer 2 consisting of a second material is formed on an upper surface of the first layer formed in the step (a). The second material is a material, which has a hardness lower than that of the first material and whose oxide is dissolved by an anodization step. The second material is, preferably, a material, which contains a metal element, a material consisting of a substance, which can form an oxygen atom-containing oxide, or a material, which possesses both of these characteristics. Examples include an aluminum alkoxide liquid material or an organic substance, which contains aluminum particles or titanium particles and the like. If the material is such a liquid material, formation is carried out by spin coating, dipping or a, similar method. Further examples include a metal material containing a substance such as tin (Sn) indium (In) or the like, which is softer than aluminum, which is oxidized by anodization and whose oxide is dissolved by anodization. If the material is such a metal, the same method as the formation method of the first layer, i.e., sputtering, vapor deposition, etc., can be used. This allows the second layer to be continuously formed from the formation of the first layer, whereby the process becomes extremely simple. Further, the employment of tin or indium makes it possible to provide an orderly porous portion without the oxidation step (d), to reduce the number of process steps.

Figure 1B:
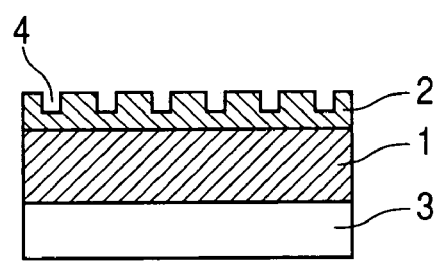
Figure 3A:
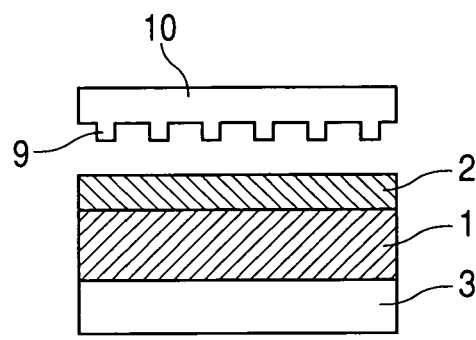
FIGS. 3A, 3B and 3C are cross-sectional views explaining the step (c) of the present invention.
Figure 3B:
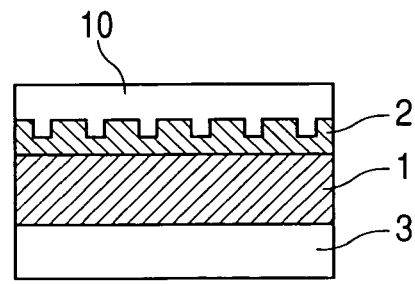
Figure 3C:
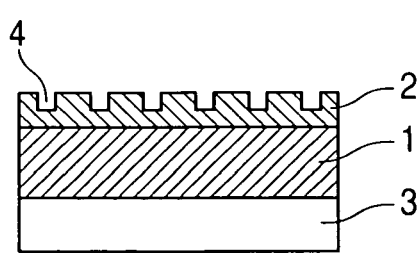

Next, as illustrated in FIG. 1B, in the step (c) a concave structure is formed on the surface of the second layer. One example of a formation method is an imprinting method such as that illustrated in FIGS. 3A through 3C. In such a method, a press member 10 comprising at least one convex structure 9 is made to face the second layer consisting of the second material (FIG. 3A), and then pulled away, to thereby form a concave structure 4 on the surface of the second layer corresponding to the convex structure pattern of the press member (FIG. 3C).

The press member is fabricated using a microstructure forming technique, such as lithography using an electron beam, X-rays, ultraviolet rays, visible light and the like, a wet etching or dry etching technique, electron beam drawing, or anodization, block polymer process and the like. The surface of the convex structure is preferably flat, and preferably consists of silicon, nickel or similar material having a high hardness. The surface of the press member is preferably conferred with a mold material such as a fluorine resin or silane coupling agent to improve the ease with which the member peels off from the second layer.

When forming a plurality of press member convex structures, the apex of each convex structure is preferably located on the same plane. Although as the convex structure pattern, the upper face view as seen from the face on which the convex structures are formed is preferably a triangular lattice away such as that illustrated in FIG. 4A, also acceptable is an away in which patterns having a different away period are continuously connected via a common portion, such as that illustrated in FIG. 4B, for example, in which a triangular lattice region 12, a rectangular lattice region 13 and a graphite lattice region 14 are continuously connected via a common portion 11. Forming an array of such differing patterns on the same surface allows a region to be formed on the same surface according to need. For example, for an HDD, it becomes possible to form differing regions, such as a recording region and a servo region.

When subjecting the second layer to anodization at the same time as the first layer, and subjecting concave structures of the second layer having a plurality of periods such as those described above to collective anodization, carrying out the anodization according to the voltage calculated from the period average allows easy formation.

Figure 1C:
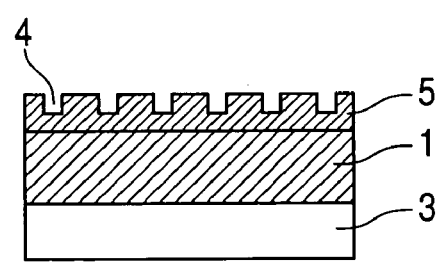

Next, as illustrated in FIG. 1C, in the step (d) the second layer consisting of a second material is oxidized by elemental oxygen. For example, the structure obtained in the step (c) is oxidized in an oxygen atmosphere at a high temperature which the first layer 1 consisting of a first material and the supporting substrate 3 are able to withstand. Alternatively, oxidation is conducted by exposing the same structure to oxygen plasma or ozone gas. As a result of oxidation, although the elemental metal contained in the second material is turned into its oxide and remains, an organic substance is carbonized. As a result of carbonization of the organic substance, the film thickness of the second layer 5 is as a whole thinner than the film thickness of the second layer 2 after concave structure formation but prior to oxidation. As a consequence, while the depth of the concave structure 4 becomes shallower, the surface apart from the second layer concave structure and the bottom of the concave structure 4 become closer to the surface of the first layer, whereby the flatness of the first layer surface is reflected in the second layer surface to a greater extent than that prior to oxidation. Thus, subjecting to oxidation enables an orderly porous body to be formed in which the uneven portions of the second material are reflected to a greater extent than if oxidation had not been carried out.

Figure 1D:
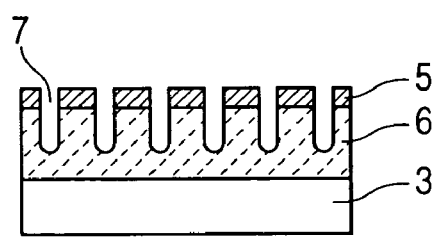

Next, in the step (e), the structure obtained in the step (d) consisting of a first layer 1 which is capped on its upper layer with a second layer 5 consisting of an oxide of the second material is immersed into a solution such as aqueous oxalic acid, aqueous phosphoric acid or aqueous sulfuric acid maintained at an appropriate temperature. Voltage is applied with the supporting substrate 3 serving as the anode, to thereby cause an oxidation reaction and an etching reaction. This is what is usually termed "anodization". If aluminum or silicon is subjected to anodization using a suitable kind of solution, temperature and voltage, it is known that a porous structure will be formed on the surface. Oxidation and dissolution by anodization preferentially begins from the concave structure portion of the second layer, so that pores of an array which reflects the concave structure pattern are formed. The term "anodization" as used in the present invention refers to not only the oxidation step, but the process consisting of the oxidation step and the etching step. In the present invention, since a substance is employed as the first material such that a porous structure is formed by anodization, a porous structure is formed which has a cross-section shape such as that illustrated in FIG. 1D.

If the second material is a material which can be oxidized and etched during the anodization of step (e), step (e) and step (d) can be combined.

The voltage applied during the anodization of step (e) is, usually, set at about $2.5^{-1}$ [V/nm] times the array period [nm] of the pores which are to be formed. For example, when forming pores of a triangular lattice array having a 100 nm interval, 40 V should be applied. Therefore, when attempting to form pores from a concave portion of a triangular lattice array concave structure formed on a surface of the second layer, even if the orderliness of the triangular lattice array is slightly disorderly, pores regularly arranged can be obtained by using the anodization applied voltage for natural correction.

Figure 1E:
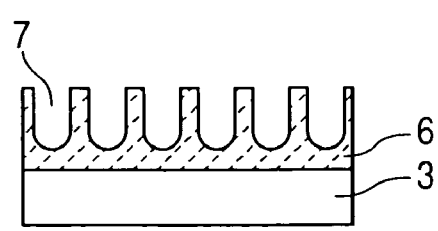

Next, as illustrated in FIG. 1E, in the step (f) it is possible to subject the fabricated pore diameter to an expanding treatment. Pore diameter is expanded by immersing a porous structure consisting of an oxide of the first material in an acidic or alkaline solution, such as aqueous phosphoric acid, which can uniformly dissolve the oxide 6 of the first material, thereby dissolving an inner face of the pores.

Figure 2:
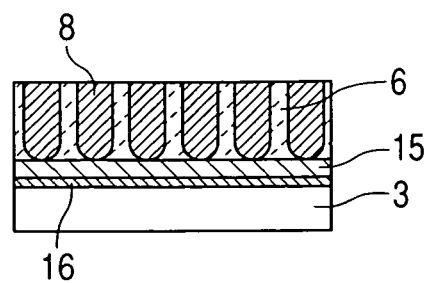
FIG. 2 is a cross-sectional view explaining the step (g) of the present invention.

Next, as illustrated in FIG. 2, in the step (g) a filler 8 can be packed into the formed pore interior. Using a method such as electrolytic plating, nonelectrolytic plating or sputtering, an arbitrary material such as a magnetic substance, a dielectric, a light-emitting material or the like can be packed into the pore interior.

EXAMPLES

Examples of the present invention will now be explained in detail with reference to the drawings.

Example 1

Example 1 of the present invention will be explained with reference to FIGS. 1A through 1E, FIGS. 3A through 3C and FIG. 4A. Example 1 is a method for producing a porous body.

First, in the step (a), aluminum serving as a first material was formed onto a supporting substrate 3 consisting of silicon to a thickness of 300 nm by sputtering.

Next, in the step (b), aluminum alkoxide in which the solvent consisted of xylene was coated onto the aluminum to a thickness of 50 nm by spin coating. The coated material was then baked for 10 minutes at 80° C. to volatize off a part of the solvent, to thereby form a film of the second material 2 (FIG. 1A).

Figure 4A:
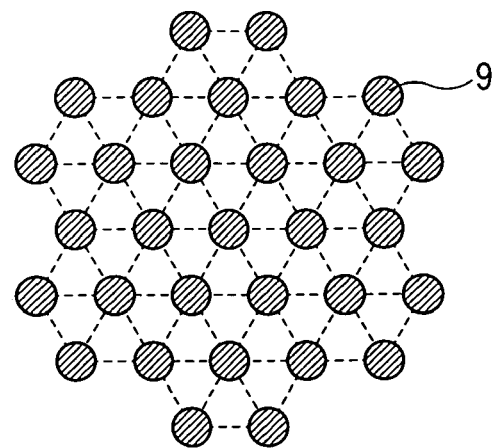
FIGS. 4A and 4B are cross-sectional views illustrating the porous body according to the present invention.
Figure 4B:
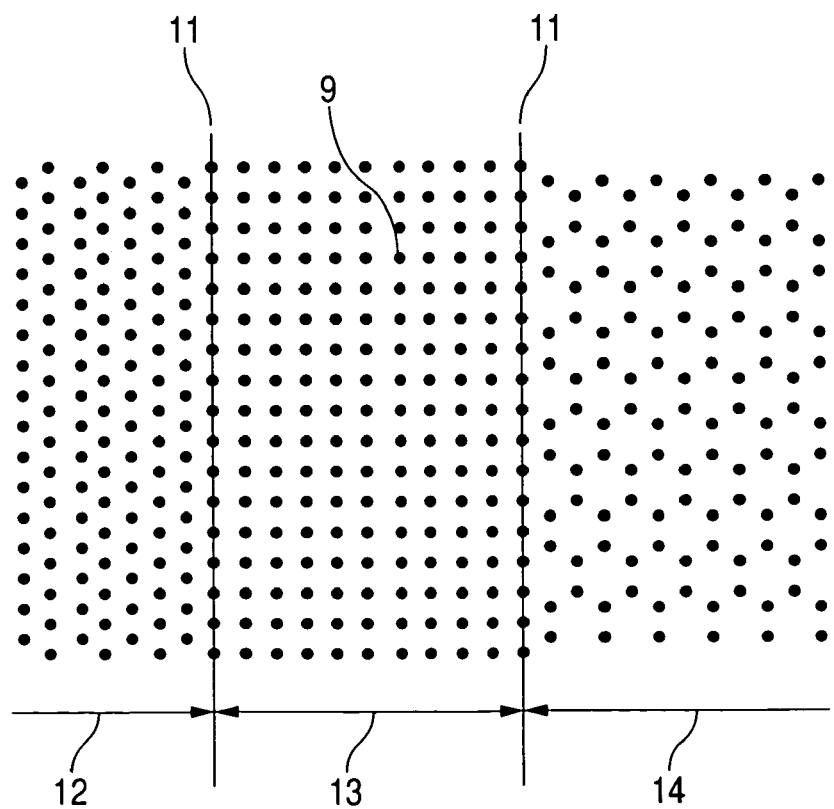

Next, in the step (c), a concave structure 4 was formed on the aluminum alkoxide 2 by an imprinting method. The reason for why only a part of the solvent was volatized off is that if the solvent was completely volatized off the aluminum alkoxide hardness would increase, thus making it more difficult to form the concave structure by imprinting. Therefore, it is preferable to set the hardness such that as a result of appropriate volatilization mold releasability is good while imprinting is still possible. Using a conventional lithography technique of electron beam exposure or dry etching, cylindrical convex structures 9 having an array as illustrated in FIG. 4A were formed on a silicon substrate in intervals of 160 nm and at a height of 150 nm, to thereby form a press member 10. The press member surface was coated with a silane coupling agent as a mold release agent to a thickness of no more than 5 nm. The press member 10 was made to face the aluminum alkoxide 2 (FIG. 3A), then pressed at 150° C. and a pressure of 400 kgf/cm$^2$ (FIG. 3B). The pressed article was held for 1 minute and then pulled away. The xylene almost completely volatized off in 1 minute at 150° C., whereby the hardness of the aluminum alkoxide layer increased, and releasability improved. As a result, a concave structure 4 having a depth of 30 nm was formed on the aluminum alkoxide surface 2 (FIG. 3C, FIG. 1B)

Next, in the step (d), upon irradiating ultraviolet rays in an ozone atmosphere using an ozone asher at 150° C. for 10 minutes while heating, the organic portion of the aluminum alkoxide was carbonized. Elemental aluminum was oxidized to form alumina, or in other words an alumina-containing oxide 5 was formed (FIG. 1C). During this process, the thickness of the oxide 5 of the aluminum alkoxide was at about 35 nm, slightly thinner than the thickness prior to oxidation.

Next, in the step (e) the aluminum 1 was subjected to anodization. The substrate was immersed into 0.3 mol/L aqueous phosphoric acid maintained at 18° C. Serving as the anode, the immersed substrate was applied with 64 V to carry out anodization. The oxide of the aluminum alkoxide was soluble in the anodization, so that the concave structure 4 became the starting point for an oxidation/dissolving phenomenon. Since the oxide 5 of the aluminum alkoxide was thin, the aluminum 1 was exposed from a bottom of the concave structure without any deviation with the position of the concave structure 4. After this, the oxidation/etching reaction by anodization continued to proceed. The formed porous structure had a cross-sectional view such as that shown in FIG. 1D. An alumina porous structure was formed in the same position as the concave structure 4.

Next, in the step (f), the obtained porous structure was immersed into 0.3 mol/L aqueous phosphoric acid to dissolve the alumina 6. As illustrated in FIG. 1E, the oxide of the aluminum alkoxide and the alumina dissolved uniformly, whereby the pores expanded to an arbitrary pore diameter.

Example 2

Example 2 of the present invention will be explained with reference to FIG. 2.

Example 2 of the present invention is a method for producing a porous body characterized in that a filler is packed into the porous body.

A porous body was fabricated in the same manner as in Example 1 using a silicon substrate as the supporting substrate, which was formed on its surface from the upper layer with a porous film of aluminum (Al, 300 nm thickness)/ titanium (Ti, 2 nm thickness)/copper (Cu, 20 nm thickness)/ titanium (5 nm thickness). Here, the copper served as a conductive layer 15 to be used as an electrodeposition electrode. The upper layer titanium was a layer provided in consideration of adherence with aluminum, while the lower layer titanium served as an underlying layer 16 for improving adherence with silicon.

Anodization was carried out as far as the bottom of the aluminum layer. Upon immersing for 1 hour in 0.3 mol/L aqueous phosphoric acid, the pore diameter was 110 nm diameter, and the pore bottom had become a copper underlying layer 16, whereby a penetrated structure was obtained. This structure was subsequently immersed as the cathode in a Watts bath nickel plating solution, and subjected to electrolytic plating by applying a voltage of 1.0 V. Once the nickel had grown from the copper of the pore bottom and overflowed from the pores, voltage application was stopped. Polishing of the surface provided a structure having a cross-sectional view such as that shown in FIG. 2. In addition to nickel, such a structure could be used as a magnetic recording medium by packing a magnetic substance such as cobalt therein. Further, by employing a method such as sputtering or spin coating and packing with a dielectric or similar substance, the structure could be used as an optical element.

Example 3

Example 3 of the present invention is a method for producing a porous body, characterized in that the second material is a film having a metal as a main component.

First, in the same manner as in Example 1 of the present invention, a silicon substrate was prepared having aluminum (300 nm thickness) sputtered thereon. Next, an alloy (50 nm thickness) of tin and indium was formed above the aluminum by the same sputtering method.

Next, in the step (c), a concave structure 4 having the same shape as that in Example 1 was formed onto the alloy 2 by an imprinting method. Because tin and indium have a hardness much lower than that of aluminum, it is possible to form a concave structure only on the alloy 2 at room temperature. In addition, since this alloy has a low viscosity, there is no need to coat the press member 10 with a mold release agent.

Next, in the step (e), anodization was carried out. The structure was immersed into 0.3 mol/L aqueous phosphoric acid maintained at 18° C. Serving as the anode, the immersed substrate was applied with 64 V, and subjected to anodization. Because this alloy is oxidized by anodization, this step also includes step (d). The oxide of this alloy was soluble in the anodization, so that the concave structure 4 became the starting point for an oxidation/dissolving phenomenon. The aluminum 1 was exposed from the bottom of the concave structure without any deviation with the position of the concave structure 4. After this, the oxidation/etching reaction by anodization continued to proceed. The formed porous structure had a cross-sectional view such as that shown in FIG. 1D, whereby an alumina porous structure was formed in the same position as the concave structure 4.

The present invention is directed to a process for producing a nanostructure using a nanoimprinting method and anodization, wherein a minute porous body can be simply produced. Therefore, by packing the porous structure with a filler such as a magnetic substance, a dielectric or a light-emitting material, the present invention can be applied to coloration, and production of an EL device, an electrochromic device, a solar cell, a vacuum microdevice, a magnetic device, a magnetic recording medium, a photonic device, a quantum effect device, a chemical sensor and the like.

This application claims priority from Japanese Patent Application No. 2004-254835 filed Sep. 1, 2004, which is hereby incorporated by reference herein.

What is claimed is:

1. A process for producing a porous body comprising the steps of:

(a) disposing a first material, which is capable of becoming porous when subjected to anodization, on a substrate to form a first layer;

(b) disposing on the first layer a second material, which has a hardness lower than that of the first material and an oxide of which is capable of being dissolved by anodization, to form a second layer;

(c) forming a concave structure on a surface of the second layer;

(d) oxidizing the second layer; and (e) subjecting the first layer to anodization to dissolve the second layer and to form pores in the first layer.

2. The process according to claim 1, wherein the first material is comprised of a material containing aluminum as a main component.

3. The process according to claim 1, wherein the second material is comprised of a material containing a metal element.

4. The process according to claim 1, wherein the second material is comprised of a material containing aluminum alkoxide as a main component.

5. The process according to claim 1, wherein the second material is comprised of a metal containing indium or tin.

6. The process according to claim 1, wherein the step (c) is a pressing step using a press member comprising a plurality of regularly arranged convex structures.

7. The process according to claim 1, further comprising a step (f) of immersing the porous body formed in the step (e) in a gas or a liquid which corrodes both an oxide of the first material and an oxide of the second material to dissolve the oxide of the first material, whereby the pore diameter is enlarged.

8. A process according to claim 1, further comprising a step (g) of packing pores of the porous body with a filler.

9. The process according to claim 8, wherein the filler is a magnetic substance, a dielectric, or a light-emitting material.

10. A magnetic recording medium comprising a first layer, which is comprised of an oxide of aluminum and comprises a porous portion on a substrate, and a second layer on the first layer, which has a hardness lower than that of the first layer and is comprised of a metal element, wherein pores in the porous portion are packed with a magnetic substance.

11. A light-emitting element comprising a first layer, which is comprised of an oxide of aluminum and comprises a porous portion on a substrate, and a second layer on the first layer, which has a hardness lower than that of the first layer and is comprised of a metal element, wherein pores in the porous portion are packed with a light-emitting material.

12. A process for producing a porous body comprising the steps of:

(a) disposing a first material, which is capable of becoming porous by anodization, on a substrate to form a first layer;

(b) disposing on the first layer a second material, which has a hardness lower than that of the first material and an oxide of which is capable of being dissolved by anodization, to form a second layer;

(c) forming a concave structure on a surface of the second layer; and (e) subjecting the first layer and the second layer to anodization.

13. The process according to claim 12, wherein the second material is made of indium or tin.

14. A process for producing a porous body comprising the steps of:

(a) disposing a first material to form a first layer;

(b) disposing a second material, which has a hardness lower than that of the first material, to form a second layer on the first layer;

(c) forming a concave structure on a surface of the second layer;

(d) oxidizing the second layer; and (e) subjecting the first layer and the second layer to anodization to form a pore in the first layer.

* * * * *